(12) United States Patent
Chen et al.

(10) Patent No.: US 6,791,172 B2
(45) Date of Patent: Sep. 14, 2004

(54) POWER SEMICONDUCTOR DEVICE MANUFACTURED USING A CHIP-SIZE PACKAGE

(75) Inventors: Shih-Kuan Chen, Taipei (TW);
Ching-Lu Hsu, Taipei (TW)

(73) Assignee: General Semiconductor of Taiwan, Ltd., Taipei (TW)

( * ) Notice: Subject to any disclaimer, the term of this patent is extended or adjusted under 35 U.S.C. 154(b) by 200 days.

(21) Appl. No.: 10/132,882

(22) Filed: Apr. 25, 2002

(65) Prior Publication Data

US 2002/0179994 A1 Dec. 5, 2002

(30) Foreign Application Priority Data

Apr. 25, 2001 (TW) ........................................ 90109900 A

(51) Int. Cl.[7] .............................................. H01L 23/52
(52) U.S. Cl. ........................ 257/678; 257/691; 257/692; 257/693
(58) Field of Search ............................... 257/691, 692, 257/693, 678

(56) References Cited

U.S. PATENT DOCUMENTS

| 3,839,660 | A | * | 10/1974 | Stryker | 257/700 |
| 5,063,434 | A | * | 11/1991 | Emoto | 257/706 |
| 5,172,214 | A | | 12/1992 | Casto | 257/676 |
| 5,229,327 | A | * | 7/1993 | Farnworth | 438/122 |
| 5,792,676 | A | * | 8/1998 | Masumoto et al. | 438/111 |
| 6,177,721 | B1 | * | 1/2001 | Suh et al. | 257/686 |
| 6,215,176 | B1 | | 4/2001 | Huang | 257/666 |
| 6,433,418 | B1 | * | 8/2002 | Fujisawa et al. | 257/696 |
| 6,521,985 | B1 | * | 2/2003 | Dossetto | 257/678 |
| 6,531,334 | B2 | * | 3/2003 | Sasano | 438/64 |
| 6,576,988 | B2 | * | 6/2003 | Corisis | 257/676 |
| 2001/0048156 | A1 | | 12/2001 | Fukuizumi | 257/728 |
| 2003/0197255 | A1 | * | 10/2003 | Nakajima et al. | 257/678 |

FOREIGN PATENT DOCUMENTS

| DE | 197 43 537 A1 | 10/1997 | ........... H01L/23/48 |
| DE | 100 03 671 A1 | 1/1999 | ......... H01L/23/495 |
| EP | 0 962 975 A2 | 12/1999 | ........... H01L/23/42 |
| JP | 4-174547 | * 6/1992 | ................. 257/676 |
| JP | 10-135380 | * 5/1998 | ........... H01L/23/34 |
| JP | 2000307017 | 11/2000 | ........... H01L/23/02 |

* cited by examiner

*Primary Examiner*—Jasmine Clark
(74) *Attorney, Agent, or Firm*—Mayer Fortkort & Williams, PC; Karin L. Williams, Esq.

(57) ABSTRACT

The present invention discloses a power semiconductor device manufactured using a chip-size package. The power semiconductor device includes a die having a first surface and a second surface opposite to the first surface; at least one lead frame, each of the at least one lead frames having a first terminal and a second terminal, the first terminal electrically connected to a corresponding terminal of the first surface or a corresponding terminal of the second surface of the die; an electrically conductive plate electrically connected to a corresponding terminal of the second surface of the die; and a packaging material used to encapsulate the die, one terminal of the lead frame and the electrically conductive plate. The second terminal of each lead frame and a surface of the electrically conductive plate opposite to the surface electrically connected to the second surface of the die are exposed to the outside of the packaging material and lie on the same plane.

27 Claims, 3 Drawing Sheets

POWER SEMICONDUCTOR DEVICE MANUFACTURED USING A CHIP-SIZE PACKAGE

BACKGROUND OF THE INVENTION

1. Field of the Invention

The invention relates to a power semiconductor device, and more particularly to a power semiconductor device manufactured using a chip-size package.

2. Description of the Related Art

FIG. 1 shows a traditional power diode device. As shown in FIG. 1, a power diode die 10 has a p-type terminal 10' and an n-type terminal 10". A first lead 12 has a first terminal 12' and a second terminal 12". The first terminal 12' is connected to the P-type terminal 10' through a solder 16. A second lead 14 has a first terminal 14' and a second terminal 14". The first terminal 14' is connected to the N-type terminal 10" through a solder 18. A packaging material 15 is used to package the power diode die 10, the first terminals 12' and 14' of the leads 12 and 14 and the solder 16 and 18.

The size of the traditional power semiconductor (for example, power diode) is much larger than that of the power diode die 10. Consequently, the traditional power semiconductor does not meet light, thin and small design requirements in the current semiconductor market.

SUMMARY OF THE INVENTION

In view of the above, an object of the present invention is to provide a power semiconductor device manufactured using a chip-size package. The advantages of a power semiconductor device manufactured using a chip-size package according to the present invention arise from the size of the power semiconductor device of the present invention being much smaller than that of the traditional power semiconductor devices, and from the leads being formed on the same plane, suitable for current surface mounting technology.

A power semiconductor device manufactured using a chip-size package according to the present invention includes a power semiconductor die having a first surface with a first surface terminal and a second surface with a second surface terminal opposite to the first surface, at least one lead frame, the lead frame having a first terminal and a second terminal, the first terminal electrically connected to the first surface terminal of the first surface or the second surface terminal of the second surface of the die, an electrically conductive plate electrically connected to the second surface terminal of the die and a packaging material used for encapsulating the die, one terminal of the at least one lead frame and the electrically conductive plate. The second terminal of said at least one lead frame and a surface of the conductive plate that is not connected to the second surface terminal of the die are exposed to the outside of the packaging material and on the same plane.

DETAILED DESCRIPTION OF THE PREFERRED EMBODIMENTS

A power semiconductor device manufactured using a chip-size package according to the present invention will be described with the following preferred embodiments.

Embodiment 1

Figure 1:
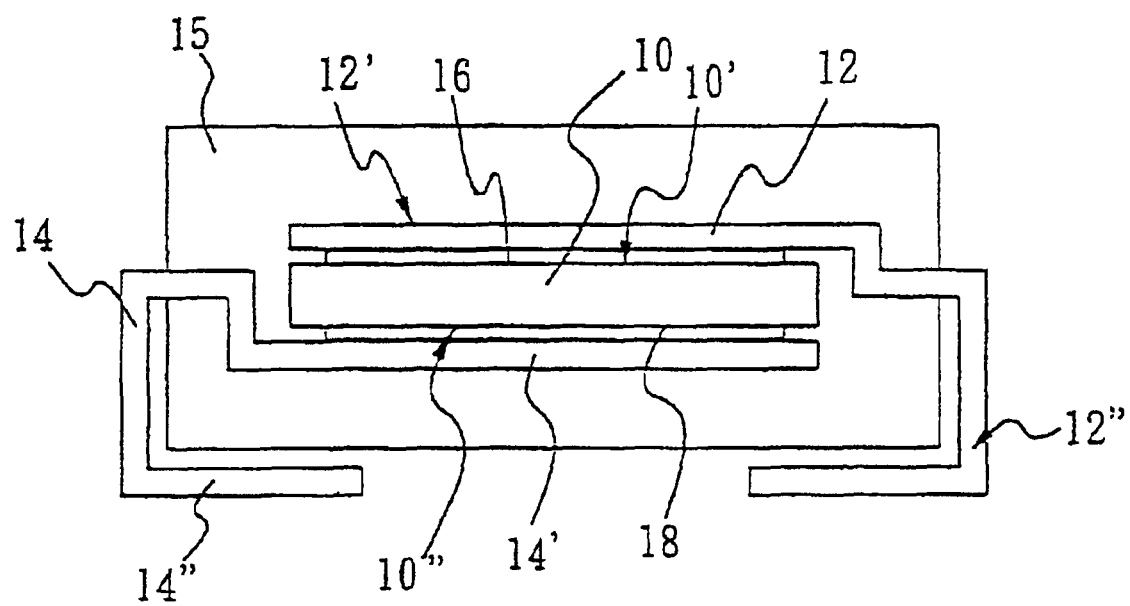
FIG. 1 shows a traditional power diode device.
Figure 2:
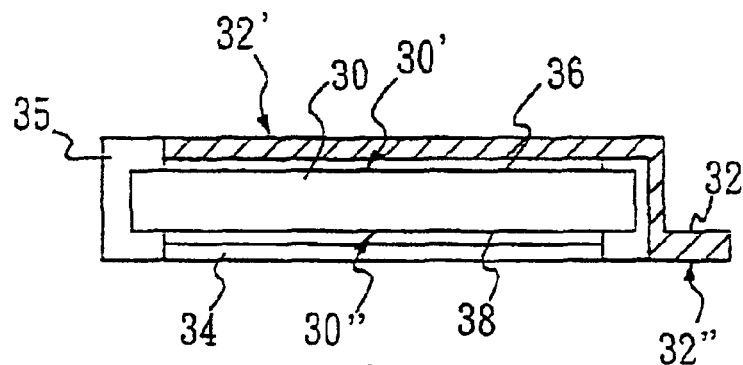
FIG. 2 shows a power semiconductor device according to a first embodiment of the present invention.

Referring to FIG. 2, a power semiconductor device manufactured using a chip-size package according to a first embodiment of the present invention is shown. In FIG. 2, a power diode die 30 has a first surface (P-type terminal) 30' and a second surface (N-type terminal) 30" opposite to the first surface. A lead frame 32 has a first terminal 32' and a second terminal 32". The first terminal 32' is connected to the first surface 30' of the power diode die 30 through a solder 36. An electrically conductive plate (for example, a copper plate) 34 is connected to the second surface 30" of the power diode die 30 through a solder 38. Moreover, a packaging material 35 is used to encapsulate the power diode die 30, the first terminal 32' of the lead frame 32, the electrically conductive plate 34 and the solder 36 and 38.

Embodiment 2

Figure 3:
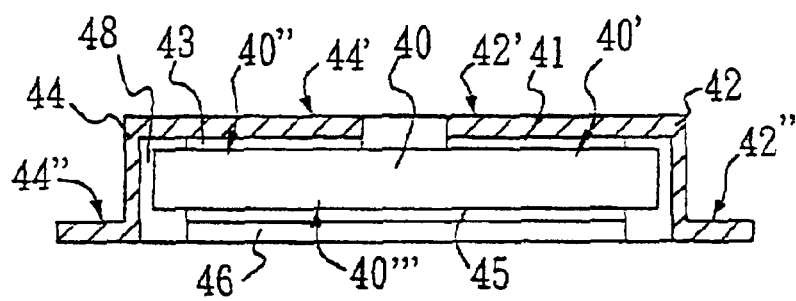
FIG. 3 shows a power semiconductor device according to a second embodiment of the present invention.

Referring to FIG. 3, a power semiconductor device manufactured using a chip-size package according to a second embodiment of the present invention is shown. In FIG. 3, a Twin power diode die 40 has a first surface and a second surface. The first surface includes a first P-type terminal 40' and a second P-type terminal 40", and the second surface includes an N-type terminal 40'". A lead frame 42 has a first terminal 42' and a second terminal 42". The first terminal 42' is connected to the first P-type terminal 40' through a solder 41. A second lead frame 44 also has a first terminal 44' and a second terminal 44". The first terminal 44' is connected to the second P-type terminal 40" though a solder 43. An electrically conductive plate (for example, a copper plate) 46 is connected to the N-type terminal 40'" through a solder 45. Furthermore, a packaging material 48 is used to encapsulate the die 40, the first terminals 42' and 44' of the first and second lead frames 42 and 44, the electrically conductive plate 46 and the solder 41, 43 and 45.

Embodiment 3

Figure 4:
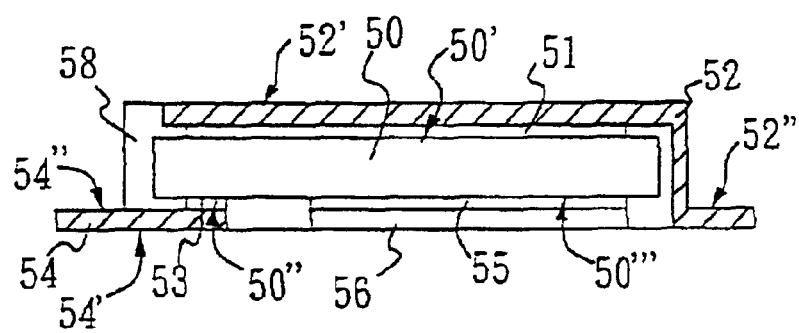
FIG. 4 shows a power semiconductor device according to a third embodiment of the present invention.

Referring to FIG. 4, a power semiconductor device manufactured using a chip-size package according to a third embodiment of the present invention is shown. As shown in FIG. 4, a power MOSFET die 50 includes a Gate 50", a Source 50'" and a Drain 50'. A first lead frame 52 has a first terminal 52' and a second terminal 52". The first terminal 52' is connected to the Source 50' through a solder 51. A second lead frame 54 also has a first terminal 54' and a second 54". The first terminal 54' is connected to the Gate 50" through a solder 53. An electrically conductive plate (for example, a copper plate) 56 is connected to the Source 50'" through a solder 55. A packaging material 58 is used to encapsulate the die 50, the first terminals 52' and 54' of the first and second lead frames 52 and 54, the electrically conductive plate 56 and the solder 51, 53 and 55.

Embodiment 4

Figure 5:
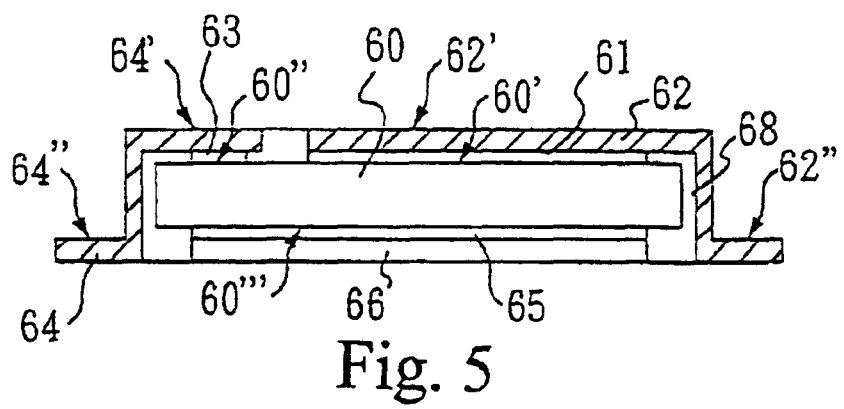
FIG. 5 shows a power semiconductor device according to a fourth embodiment of the present invention.

Referring to FIG. 5, a power semiconductor device manufactured using a chip-size package according to a fourth embodiment of the present invention is shown. As shown in FIG. 5, a power MOSFET die 60 includes a Gate 60", a Source 60' and Drain 60'''. A first lead frame 62 has a first terminal 62' and a second terminal 62". The first terminal 62' is connected to the Source 60' through a solder 61. A second lead frame 64 also has a first terminal 64' and a second terminal 64". The first terminal 64' is connected to the Gate 60" through a solder 63. An electrically conductive plate (for example, a copper plate) 66 is connected to the Drain 60''' through a solder 65. A packaging material 68 is used to encapsulate the die 60, the first terminals 62' and 64' of the first and second lead frames 62 and 64, the electrically conductive plate 66 and the solder 61, 63 and 65.

Embodiment 5

Figure 6:
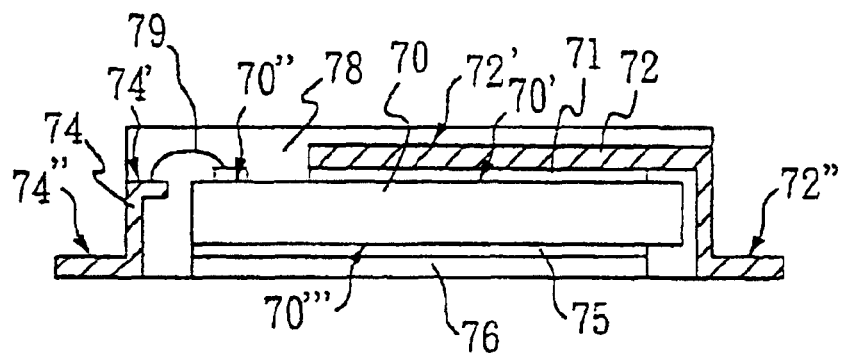
FIG. 6 shows a power semiconductor device according to a fifth embodiment of the present invention.

Referring to FIG. 6, a power semiconductor device manufactured using a chip-size package according to a fifth embodiment of the present invention is shown. In FIG. 6, a power MOSFET die 70 includes a Gate 70", a Source 70' and Drain 70'''. A first lead frame 72 has a first terminal 72' and a second terminal 72". The first terminal 72' is connected to the Source 70' through a solder 71. A second lead frame 74 also has a first terminal 74' and a second terminal 74". The first terminal 74' is connected to the Gate 70" through a boding wire 79. An electrically conductive plate (for example, a copper plate) 76 is connected to the Drain 70''' through a solder 75. A packaging material 78 is used to encapsulate the die 70, the first terminals 72' and 74' of the first and second lead frames 72 and 74, the electrically conductive plate 76, the bonding wire 79 and the solder 71, 73 and 75.

Embodiment 6

Figure 7:
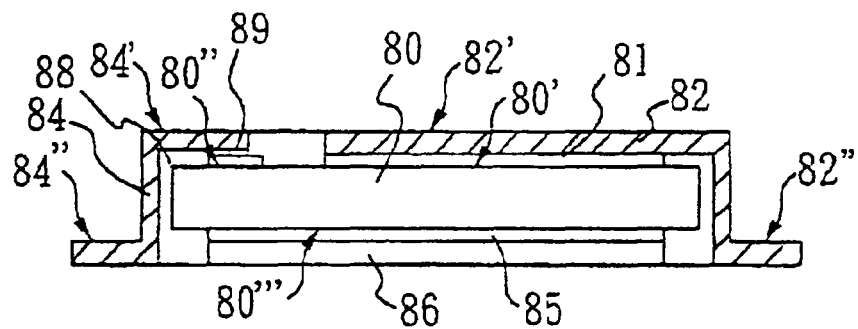
FIG. 7 shows a power semiconductor device according to a six embodiment of the present invention.

Referring to FIG. 7, a power semiconductor device manufactured using a chip-size package according to a sixth embodiment of the present invention is shown. In FIG. 7, a power MOSFET die 80 includes a Gate 80", a Source 80' and a Drain 80'''. A first lead frame 82 has a first terminal 82' and a second terminal 82". The first terminal 82' is connected to the Source 80' through a solder 81. A second lead frame 84 also has a first terminal 84' and a second terminal 84". The first terminal 84' is connected to the Gate 80" through a silver paste 89. An electrically conductive plate (for example, a copper plate) 86 is connected to the Drain 80''' through a solder 85. A packaging material 88 is used to encapsulate the die 80, the first terminals 82' and 84' of the first and second lead frame 82 and 84, the silver paste 89 and the solder 81, 83 and 85.

According to the present invention, the advantages of a power semiconductor device manufactured using a chip-size package reside in that the size of the power semiconductor device of the present invention is much smaller than that of the traditional semiconductor devices, and that the leads are formed on the same plane, suitable for current surface mounting technology of circuit boards.

Although the invention has been disclosed in terms of preferred embodiments, the disclosure is not intended to limit the invention. Those knowledgeable in the art can make modifications within the scope and spirit of the invention which is determined by the claims below.

What is claimed is:

1. A power semiconductor device, comprising:

a die having a first surface terminal and a second surface terminal opposite to the first surface;

at least one lead frame, said at least one lead frame having a first terminal and a second terminal, the first terminal electrically connected to the first surface terminal of said die;

an electrically conductive plate electrically connected to the second surface terminal of said die; and a packaging material used for encapsulating said die, one terminal of said at least one lead frame and said electrically conductive plate, wherein the second terminal of said at least one lead frame, and a surface of said electrically conductive plate that is not connected to the second surface terminal of said die, are exposed outside of said packaging material and are on a same plane.

2. The power semiconductor device as claimed in claim 1, wherein said die is a power diode die.

3. The power semiconductor device as claimed in claim 2, wherein the first surface terminal is a P-type terminal, and the second surface terminal is an N-type terminal.

4. The power semiconductor device as claimed in claim 3, wherein the first terminal of said at least one lead frame is electrically connected to the P-type terminal of said die.

5. The power semiconductor device as claimed in claim 3, wherein the first terminal of said at least one lead frame is electrically connected to the P-type terminal of said die through a solder.

6. The power semiconductor device as claimed in claim 3, wherein said electrically conductive plate is electrically connected to the N-type terminal of said die.

7. The power semiconductor device as claimed in claim 3, wherein said electrically conductive plate is electrically connected to the N-type terminal of said die though a solder.

8. The power semiconductor device as claimed in claim 1, wherein said die is comprised of two connected power diodes.

9. The power semiconductor device as claimed in claim 8, wherein the first surface terminal has a first P-type terminal and a second P-type terminal, and the second surface terminal is an N-type terminal.

10. The power semiconductor device as claimed in claim 9, wherein said at least one lead frame is two lead frames, a first lead frame and a second lead frame, the first terminal of said first lead frame electrically connected to the first P-type terminal of said die, and the first terminal of said second lead frame electrically connected to the second P-type terminal of said die.

11. The power semiconductor device as claimed in claim 9, wherein said at least one lead frame is two lead frames, a first lead frame and a second lead frame, the first terminal of said first lead frame electrically connected to the first P-type terminal of the die Through a solder, and the first terminal of said second lead frame electrically connected to the second P-type terminal of said die through a solder.

12. The power semiconductor device as claimed in claim 9, wherein said electrically conductive plate is electrically connected to the N-type terminal of said die.

13. The power semiconductor device as claimed in claim 9, wherein said electrically conductive plate is electrically connected to the N-type terminal of said die through a solder.

14. The power semiconductor device as claimed in claim 1, wherein said die is a power MOSFET die.

15. The power semiconductor device as claimed in claim 14, wherein the first surface has a gate and a source, and the second surface has a drain.

16. The power semiconductor device as claimed in claim 15, wherein said at least one lead frame is two lead frames, a first lead frame and a second lead frame, the first terminal of said first lead frame is electrically connected to the gate of said die, the first terminal of said second lead frame is electrically connected to the source of said die.

17. The power semiconductor device as claimed in claim 15, wherein said at least one lead frame is two lead frames, a first lead frame and a second lead frame, the first terminal of said first lead frame electrically connected to the gate of said die through a solder, the first terminal of said second lead frame electrically connected to the source of said die through a solder.

18. The power semiconductor device as claimed in claim 15, wherein said at least one lead frame is two lead frames, a first lead frame and a second lead frame, the first terminal of said first lead frame electrically connected to the gate of said die through a bonding wire, the first terminal of said second lead frame electrically connected to the source of said die through a solder.

19. The power semiconductor device as claimed in claim 15, wherein said at least one lead frame is two lead frames, a first lead frame and a second lead frame, the first terminal of said first lead frame electrically connected to the gate of said die through a silver paste, the first terminal of said second lead frame electrically connected to the source of said die through a solder.

20. The power semiconductor device as claimed in claim 15, wherein said electrically conductive plate is electrically connected to the drain of said die.

21. The power semiconductor device as claimed in claim 15, wherein said electrically conductive plate is electrically connected to the drain of said die through a solder.

22. A power semiconductor device, comprising:
   a die having a first surface terminal and a second surface terminal opposite to the first surface;
   at least one lead frame, said at least one lead frame having a first terminal and a second terminal, the first terminal electrically connected to the second surface terminal of said die;
   an electrically conductive plate electrically connected to the second surface terminal of said die; and
   a packaging material used for encapsulating said die, one terminal of said at least one lead frame and said electrically conductive plate,
   wherein the second terminal of said at least one lead frame, and a surface of said electrically conductive plate that is not connected to the second surface terminal of said die, are exposed outside of said packaging material and are on a same plane.

23. The power semiconductor device as claimed in claim 22, wherein the first surface comprises a drain, and the second surface comprises a gate and a source.

24. The power semiconductor device as claimed in claim 22, wherein said at least one lead frame is two lead frames, a first lead frame and a second lead frame, the first terminal of said first lead frame electrically connected to the drain of said die, and the first terminal of said second lead frame electrically connected to the gate of said die.

25. The power semiconductor device as claimed in claim 22, wherein said at least one lead frame is two lead frames, a first lead frame and a second lead frame, the first terminal of said first lead frame electrically connected to the drain of the die through a solder, and the first terminal of said second lead frame electrically connected to the gate of said die through a solder.

26. The power semiconductor device as claimed in claim 22, wherein said electrically conductive plate is electrically connected to the source of said die.

27. The power semiconductor device as claimed in claim 22, wherein said electrically conductive plate is electrically connected to the source of said die through a solder.

* * * * *